ated crossed electric and magnetic fields is provided on an
United States Patent Sato et al.

[11] Patent Number: 5,731,580
[45] Date of Patent: Mar. 24, 1998

[54] SCANNING ELECTRON MICROSCOPE

[75] Inventors: Mitsugu Sato; Naomasa Suzuki, both of Hitachinaka, Japan

[73] Assignee: Hitachi, Ltd., Tokyo, Japan

[21] Appl. No.: 770,076

[22] Filed: Dec. 19, 1996

[30] Foreign Application Priority Data

Dec. 20, 1995 [JP] Japan .................................. 7-331492

[51] Int. Cl.[6] .......................... H01J 37/256; H01J 37/244
[52] U.S. Cl. ............................................. 250/310; 250/397
[58] Field of Search ................................. 250/310, 397

[56] References Cited

U.S. PATENT DOCUMENTS

| 4,288,692 | 9/1981 | Schamber et al. | 250/310 |
| 4,697,080 | 9/1987 | King | 250/310 |
| 4,751,393 | 6/1988 | Corey, Jr. et al. | 250/397 |

FOREIGN PATENT DOCUMENTS 6-132002  5/1994  Japan .

*Primary Examiner*—Jack I. Berman
*Attorney, Agent, or Firm*—Kenyon & Kenyon

[57] ABSTRACT

A scanning electron microscope in which means for generating crossed electric and magnetic fields is provided on an electron source side of an objective lens, secondary electrons emitted from a specimen are detected through the crossed electric and magnetic fields (E+B), a deflecting electrode or a deflecting coil is provided in a scanning coil part, means for detecting a beam current is provided in the crossed electric and magnetic fields, whereby accurate measurement of the beam current can be realized while maintaining the array of a high resolution optical system without need for performing mechanical or electrical adjustment.

22 Claims, 5 Drawing Sheets

SCANNING ELECTRON MICROSCOPE

BACKGROUND OF THE INVENTION

The present invention relates to electron microscopes and more particularly, to a scanning electron microscope which can suitably form a high resolution image and can easily measure and set an electron beam current to be irradiated on a specimen and also to an apparatus similar thereto.

In order to obtain a secondary electron image of a high resolution, it has conventionally been employed to shorten the focal length of an objective lens and detect secondary electrons emitted from a specimen with use of a secondary electron detector disposed on an electron source side of the objective lens. In this connection, for the purpose of preventing a primary electron beam from being influenced by a voltage applied to the secondary electron detector, there has been suggested a method by which a means for generating crossed electric and magnetic fields is provided on an electron source side of an objective lens to cause secondary electrons emitted from a specimen to be guided to a secondary electron detector, as shown in JP-A-6-132002.

In order to obtain a secondary electron image having a high resolution in the scanning electron microscope, however, it is necessary to select a suitable beam current (specimen irradiation current) according to the used specimen. Further, it is important to grasp the beam current for X-ray analysis. To this end, there has been so far employed such a method that there is provided a Faraday cup at part of a specimen base so that the Faraday cup is arranged to allow movement of the Faraday cup on the specimen base toward a beam irradiation point at the time of measuring a beam current, or there is provided a Faraday cup system capable of mechanical movement thereof to an optical axis on the objective lens side of a final aperture plate so that the Faraday cup is moved on the optical axis at the time of measuring a beam current.

However, such a prior art has had a defect that an operator loses sight of part of a specimen under observation due to measurement of the beam current, the mechanical position adjustment of the Faraday cup is troublesome, and manufacturing costs become expensive.

SUMMARY OF THE INVENTION

It is therefore an object of the present invention to a scanning electron microscope which can eliminate the above defect in the prior art, can have a function of measuring a beam current at a high speed without losing an observation part and without any need for mechanical position adjustment, and can avoid reduction of a resolution caused by the possession of this function.

The above object is attained by disposing means for detecting a primary electron current in the vicinity of a passage of the primary electron beam and by providing means for deflecting the primary electron beam in the primary electron current detecting means.

Further, a final aperture plate with respect to the primary electron beam is arranged on an electron source side as viewed from the primary electron current detecting means or the deflecting means.

Furthermore, a condenser lens is disposed between the primary electron beam current detecting means and the final aperture plate.

The primary electron beam current detecting means is formed to have a groove shape.

The primary electron beam current detecting means in the form of the groove is arranged along the inner wall of beam path in a scanning electron microscope. More in detail, the primary electron beam current detecting means having the groove structure is added to a constituent element of means for generating crossed electric and magnetic fields. Deflecting means for positioning the primary electron beam with respect to the primary electron beam current detecting means is provided at the same position as a scanning coil.

When the electron microscope is arranged to detect the primary electron current while deflecting the beam, there is provided means for detecting a maximum of an output of the current detecting means when the beam is deflected.

Means for inputting the beam current is provided, and means for controlling a condenser lens for control of the beam current disposed on an electron source side of the final aperture plate is provided so that a current value inputted from the beam current input means coincides with an output of the maximum detecting means.

With such an arrangement as mentioned above, the present invention operates as follows.

When the primary electron beam is positioned at the primary electron beam current detecting means by the deflection means, the primary electron current can be detected.

Further, since the primary electron current is based on primary electrons passed through the final aperture plate, the primary electron current to be irradiated on the specimen can be accurately detected.

When the primary electron beam deflection means is located at the same position as the primary electron beam scanning coil and the beam current detecting means is built in part of the crossed electric and magnetic fields generating mean, the beam current can be detected without need for changing the arrangement of the electron optical system optimum for the observation of high resolution. That is, in such an optical system, when a distance between the scanning coil and objective lens becomes long, the system be susceptible to the influences of such disturbance as stray magnetic field and, at the same time, it becomes difficult to realize a low magnification. Thus, when the beam current detecting means is built in part of the crossed electric and magnetic fields provided as a constituent element structurally indispensable in obtaining a high resolution image, the detection of the beam current can be realized without need for making long the distance between the scanning coil and objective lens.

Further, the longer the beam scanning distance from the electron source to the specimen is the more easily the primary electron beam becomes influenced by stray magnetic field. However, the employment of the arrangement of the present invention eliminates the need for making the beam path long even when the primary electron current detector is provided, thus preventing reduction of the resolution caused by the stray magnetic field.

Since the beam current detecting means has such a groove structure as shown in FIG. 2, the deflection means for detecting the beam current can advantageously be merely required to deflect in only one direction, the deflection means can be implemented with a simple electrodes or a one-direction deflecting coil and can be simply controlled.

In order to prevent emission of secondary electrons or reflected electrons from an inlet (beam incident aperture) of the beam current detecting groove to perform accurate detection of the beam current, it is desirable to make the beam incident aperture as narrow as possible. However, when the beam incident aperture is made narrow, the accurate detection of the beam current cannot be realized without accurately deflecting the beam to the incident aperture.

Meanwhile, the output of the beam current detecting means becomes maximum when the beam is deflected just to the beam incident aperture. For this reason, in accordance with the present invention, there is provided maximum value detecting means for deflecting the primary electron beam while monitoring the output of the beam current detecting means to detect the maximum output of the beam current detecting means. The maximum value detecting means and beam deflection control means enable accurate detection of the beam current.

In accordance with the present invention, the groove-shaped detector elongated in a direction nearly perpendicular to the deflecting direction of the primary electron beam is provided. Therefore, even when the central locus of the primary electron beam is deviated from the mechanical center of the deflector, such a situation can be avoided that the deflecting direction is different from the position of the detector. Further, even when the deflecting means is relatively simple, the primary electron beam can be positioned accurately on the detector.

Further, the condenser lens is located between the final aperture plate and beam current detecting means to focus the beam in the vicinity of the incident aperture of the beam current detecting means, so that the beam current detecting groove can be made narrower in width to increase the detection accuracy of the beam current.

Furthermore, since means for controlling the condenser lens for beam current adjustment disposed on the electron source side of the final aperture plate can control the condenser lens while detecting the beam current in such a manner that the detected beam current becomes a preset value, the specified beam current can be accurately realized.

That is, when the deflection position indicative of the maximum current value of the primary electron beam is previously specified by the aforementioned means and the condenser lens for beam current adjustment is controlled with the primary electron beam deflected to that position, the beam current to be irradiated on the specimen can be accurately set.

DESCRIPTION OF THE PREFERRED EMBODIMENTS

Figure 1:
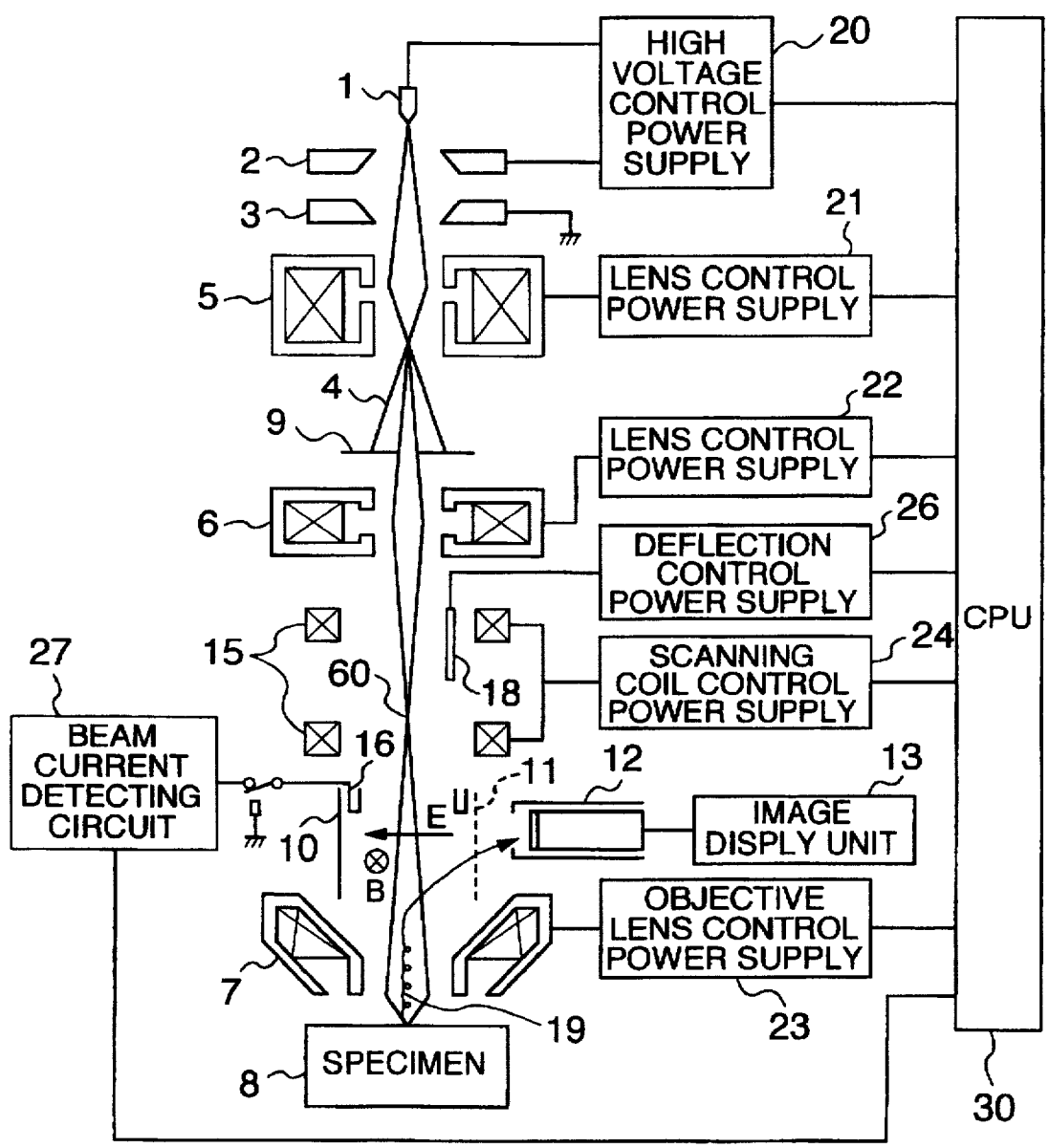
FIG. 1 is a schematic cross-sectional view of an embodiment of the present invention.

FIG. 1 schematically shows a cross-sectional view of an embodiment of the present invention. In the drawing, a voltage from a high voltage control power supply 20 under control of a microprocessor (CPU) 30 is applied between a cathode 1 and a first anode 2 so that a predetermined emission current is drawn from the cathode. Since an accelerating voltage is applied from the high voltage control power supply 20 under control of the CPU 30 to between the cathode 1 and a second anode 3, a primary electron beam 4 emitted from the cathode 1 is accelerated and proceeds to a lens system to be explained alter. The primary electron beam 4 is converged or focused by a condenser lens 5 for beam current control under control of a lens control power supply 21, and then subjected to removing operation of unnecessary beam part by a final aperture plate 9. Thereafter, the beam is focused to a very small spot on a specimen 8 by a condenser lens 6 for optical magnification adjustment under control of a lens control power supply 22 and by an objective lens 7 under control of an objective lens control power supply 23, and then two-dimensionally scanned on the specimen by a scanning coil 15. A scanning signal for the scanning coil 15 is controlled by a scanning coil control power supply 24 according to an observation magnification. A convergence angle (beam aperture angle) for the primary electron beam is optimumly determined by the focal positions of the final aperture plate 9 of the objective lens and of the condenser lens 6 for optical magnification adjustment. Arranged on the objective lens side of the scanning coil 15 are electrodes 10 and 11 to which negative and positive voltages are applied respectively to establish an electric field E.

Also arranged in the electric field E is a coil which is perpendicular to the electric field E to generate a magnetic field B, thus establishing crossed electric and magnetic fields corresponding to a combination of the magnetic field B and electric field E. The intensities of the electric field E and magnetic field B in the crossed electric and magnetic fields are set so that the deflecting actions of the electric and magnetic fields E and B with respect to the primary electron beam will cancel each other. Meanwhile, secondary electrons 19 emitted from the specimen are deflected toward the secondary electron detector side under the influence of the crossed electric and magnetic fields. Since the electrode 11 provided on the secondary electron detector side is made of such a meshed metal plate that can pass the secondary electrons therethrough, the secondary electrons are passed through the electrode 11 to be detected by a secondary electron detector 12. An output signal (image signal) of the secondary electron detector is displayed on an image display unit 13 as an SEM (scanning electron microscope) image.

Figure 2:
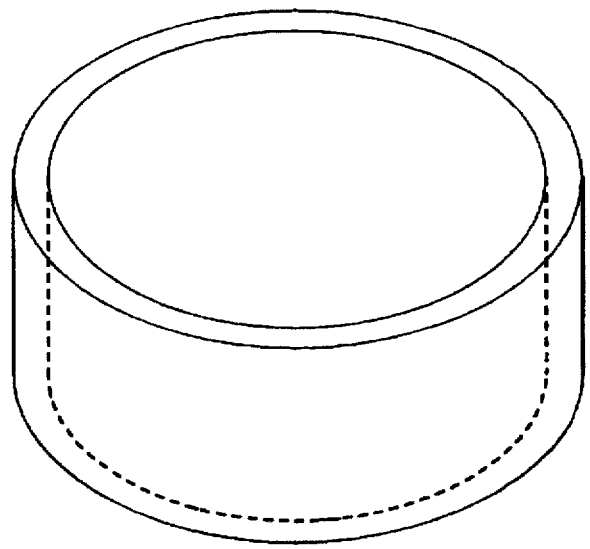
FIG. 2 shows a structure of a current detecting means.
Figure 3:
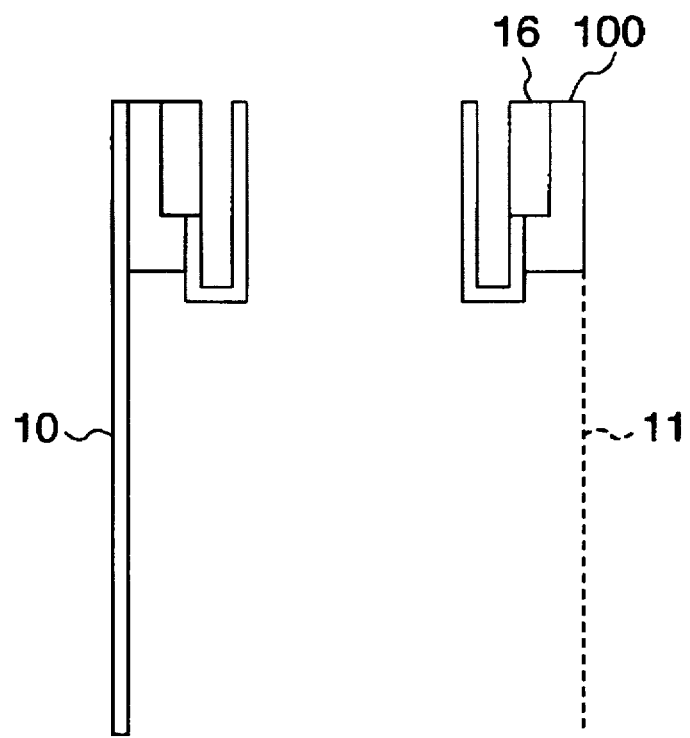
FIG. 3 shows a location of the current detecting means.

Arranged inside the scanning coil 15 is a plate of electrode 18, which potential is controlled by a deflection control power supply 26. The electrode 18 is grounded in a usual image observation mode, but when it is desired to measure the beam current, a negative voltage is applied to the electrode 18 to deflect the primary electron beam 4 to a beam current detecting means 16. The electrode 18, even when replaced by a deflecting coil lap-wound on the scanning coil, can perform a function similar to the above. The beam current detecting means 16 has such a structure having a groove in its circumferential part as shown in FIG. 2, whereby, when the beam enters the groove, the beam current detecting means 16 can function as a Faraday cup and can detect the beam current. Coated on the inside wall of the groove in the current detecting means is substance such as carbon that emits less secondary or reflected electrons even when subjected to irradiation of the electron beam, so that the current detecting means can accurately detect a current based on the electron beam incident to the groove. The current detecting means is also electrically isolated by an insulator 100 which is disposed between the electrodes 10 and 11 and is grounded in the usual image observation mode, as shown in FIG. 3.

The condenser lens 6 is controlled so that, when it is desired to measure at least the beam current, the primary electron beam focuses in the vicinity of the incident aperture of the primary electron current detecting means and, after the beam current is measured, the control condition is returned to its original one. However, when a focused point 60 of the primary electron beam under high resolution operational conditions is present in the vicinity of the primary electron current detecting means, it is unnecessary to change the exciting conditions of the condenser lens 6 for optical magnification adjustment at the time of the beam current detection.

When it is desired to measure the primary electron current, the beam current detecting means 16 is disconnected from ground and connected to a beam current detecting circuit 27.

And the CPU 30 reads an output of the beam current detecting circuit 27 while gradually increasing the voltage of the deflection control power supply 26. In the embodiment of the present invention, since the groove of the beam current detecting means is circumferentially located, the deflecting direction of the beam may be set to be arbitrary. For this reason, even when the central locus (optical axis) of the primary electron beam is deviated from the mechanical center of the deflector, the primary electron beam can be accurately moved to the groove of the beam current detecting means. Although the primary electron detecting means is made to be of a cylindrical shape in the present embodiment, the detecting means can obtain the similar effect to the cylindrical shape, so long as it is located a relative position with respect to the deflecting electrode and has a groove having a length exceeding a predetermined constant value. In the present embodiment of the invention, since the primary electron current detector is formed to be arc in shape, the detector can be easily mounted along the inner wall of the beam path in a generally-cylindrical scanning electron microscope.

Figure 4:
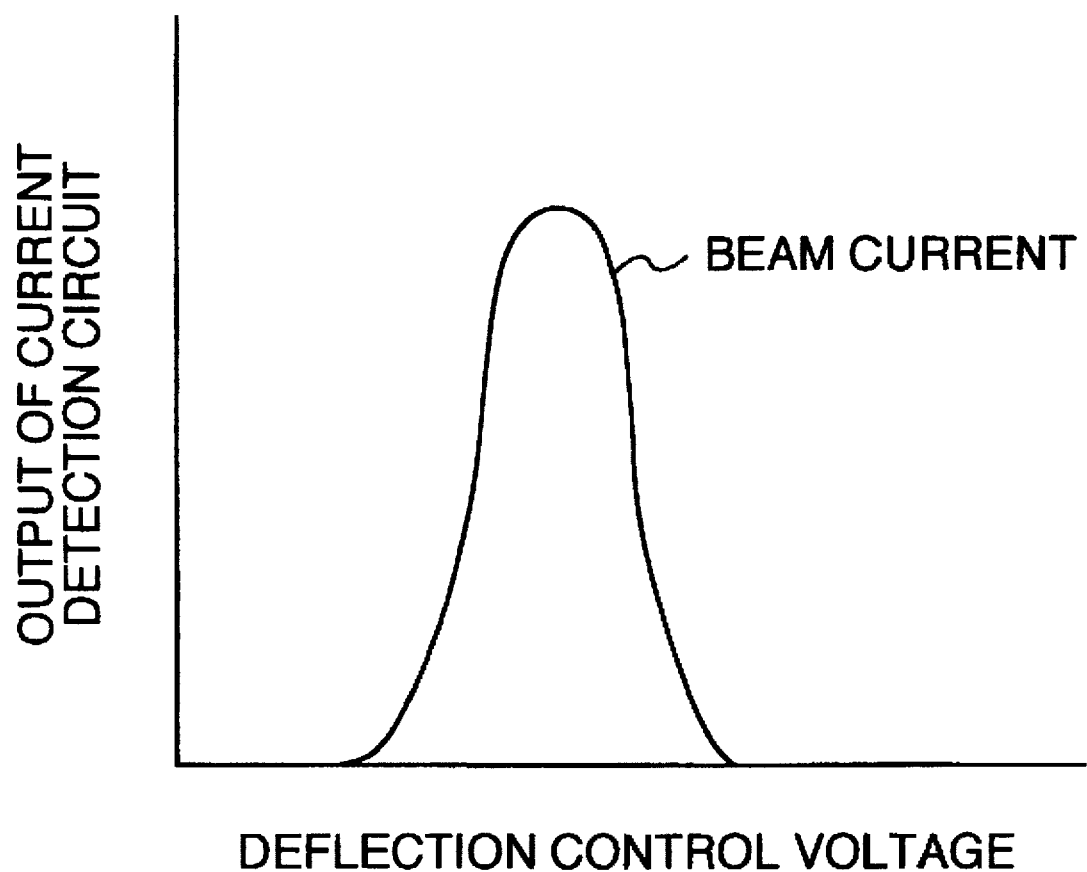
FIG. 4 is a graph showing a relationship between an output of the current detecting means and a deflection control voltage.

In this case, the output of the beam current detecting circuit 27 varies with respect to the deflection control voltage as shown in FIG. 4 and, when such a deflection control voltage is applied that causes the beam to be positioned at the groove position of the beam current detecting means 16, the output of the beam current detecting circuit 27 becomes maximum. Accordingly, when the CPU 30 increases the deflection control voltage while judging whether or not the output of the beam current detecting circuit 27 became maximum to thereby detect the maximum output of the beam current detecting circuit 27, the beam current can be accurately measured.

Figure 5:
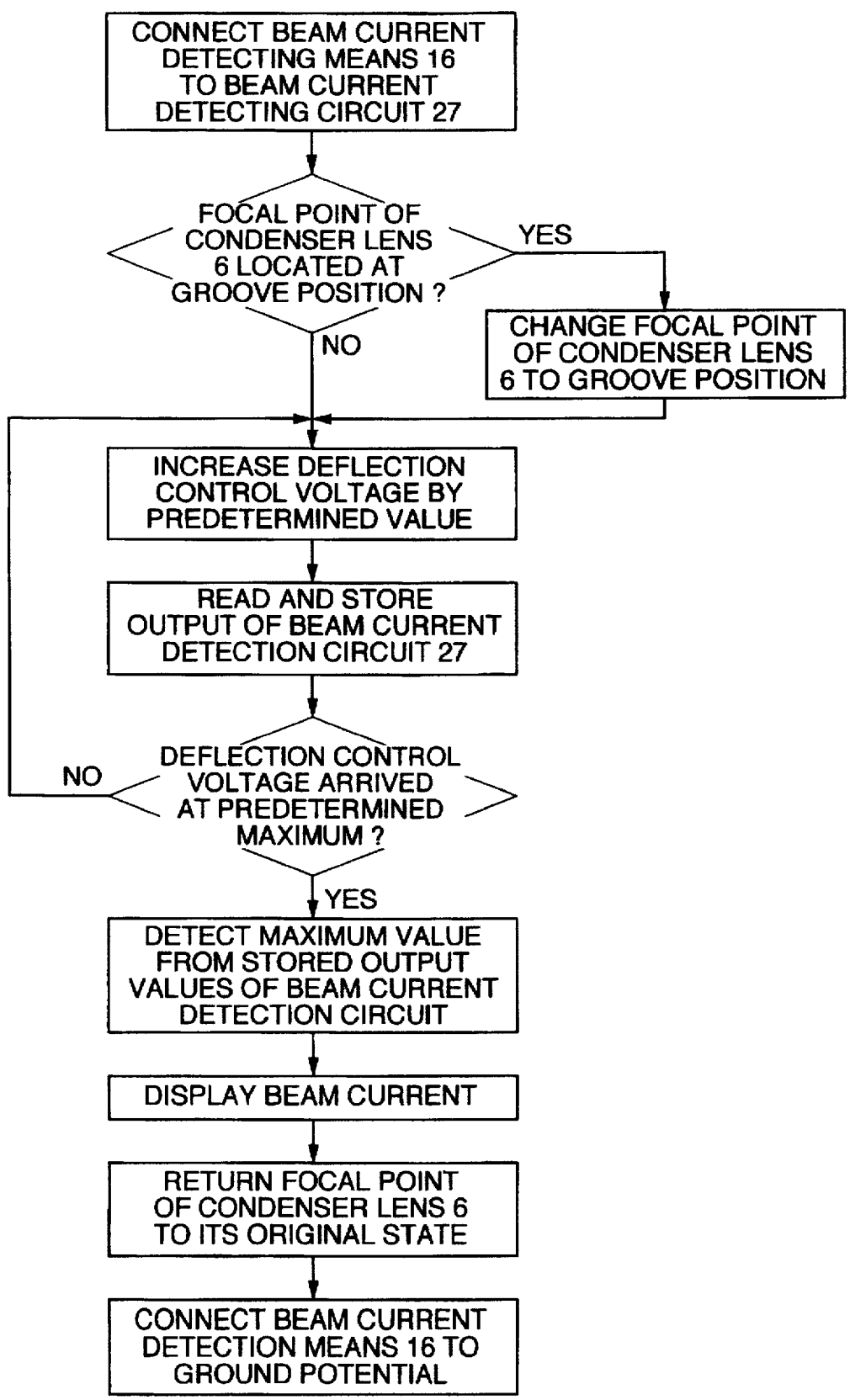
FIG. 5 is a flowchart for explaining how to measure a beam current.

A procedure in the aforementioned beam current measurement mode is shown by a flowchart in FIG. 5.

When the beam current is set at a preset value, a voltage is applied to the electrode 18 to deflect the primary electron beam up to the beam current detecting means 16, and the exciting of the condenser lens 5 for beam current control is controlled so that the output signal of the beam current detecting circuit 27 coincides with the preset beam current value.

Figure 6:
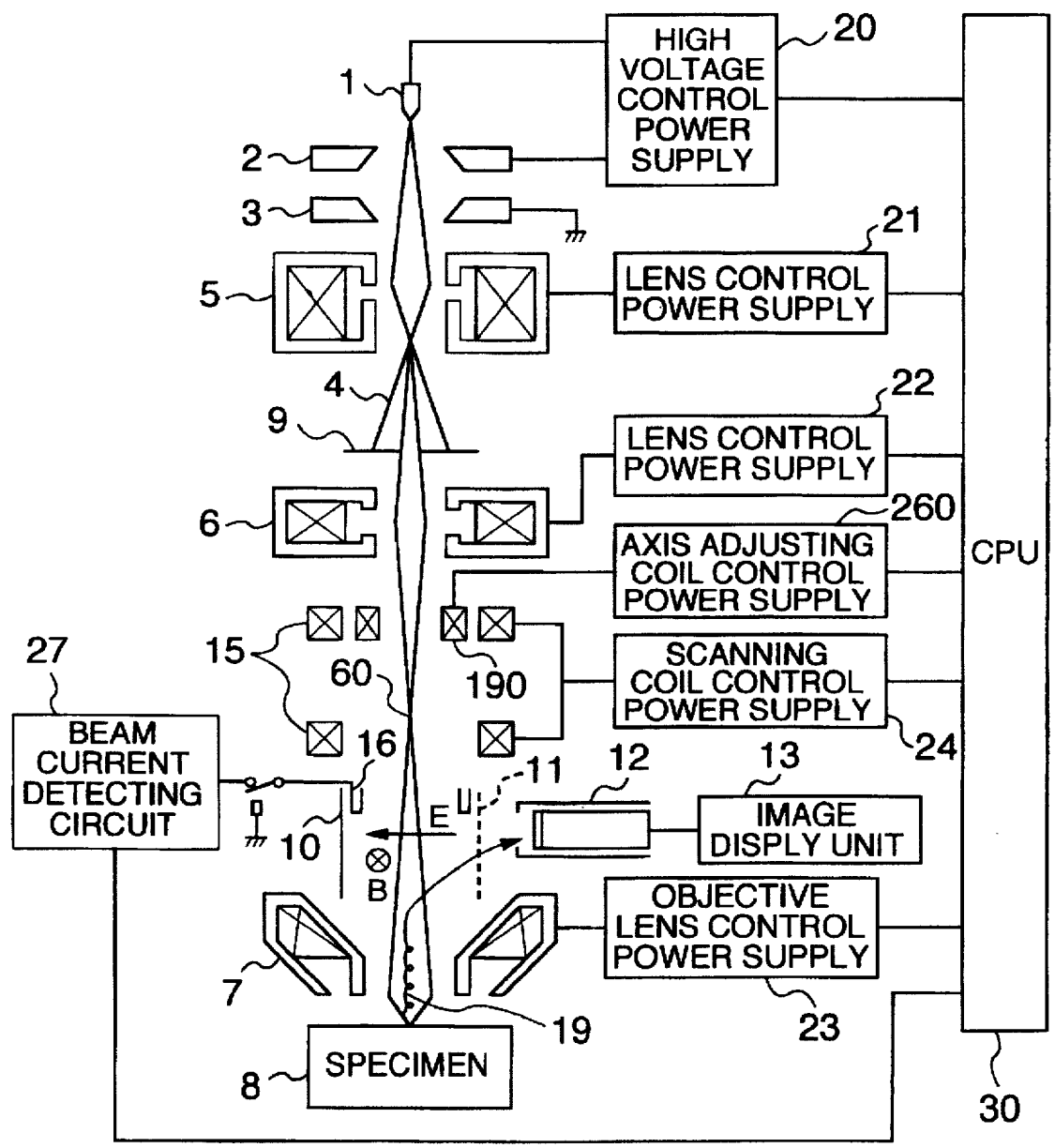
FIG. 6 schematically shows a cross-sectional view of another embodiment of the present invention.

Shown in FIG. 6 is another embodiment where beam deflection is realized at the time of detecting the beam current. Arranged in the deflecting coil part is, in addition to the scanning coil 15 for two-dimensionally scanning the beam on the specimen, an axis adjusting coil 190 for registering the central locus of the scanning beam with the center of the objective lens 7. In the usual observation mode, the current of the axis adjusting coil 190 is set by an axis adjusting coil control power supply 260 so that the locus of the beam passes through the center of the objective lens.

In the beam current detection mode, the CPU gradually increases the current of the axis adjusting coil 190 while monitoring the output of the beam current detecting circuit 27 and detects such a beam current that causes the output of the beam detecting means to become maximum. With such an arrangement as mentioned above, the deflecting means for detection of the primary electron current can be provided by a relatively simple means while preventing the ideal optical array from being collapsed.

In accordance with the arrangement of the present invention, since there is no need for changing the positional relation of the constituent elements of the electronic optical system allowing high resolution observation, the measurement and setting of the beam current can be advantageously realized while maintaining a high resolution. Further, since it is unnecessary to make the beam path long for the purpose of measuring the beam current, the system can be avoided from being easily influenced by stray magnetic field. Furthermore, since the need for perform mechanical or electrical adjustment is eliminated, accurate measurement of the beam current can be advantageously realized.

What is claimed is:

1. A scanning electron microscope in which a primary electron beam emitted from an electron source is scanned on a specimen and secondary electrons emitted from the specimen being detected to obtain a scan image, said scanning electron microscope comprising a primary electron current detector in the form of a groove for detecting a primary electron current, provided in the vicinity of a path of the primary electron beam and deflection means for deflecting the primary electron beam into the detector.

2. A scanning electron microscope as set forth in claim 1, wherein said groove-shaped primary electron current detector is elongated in a direction substantially perpendicular to a deflection direction of said deflection means.

3. A scanning electron microscope as set forth in claim 1, wherein said primary electron current detector is arranged between an objective lens for converging the primary electron beam and a final aperture plate for limiting the primary electrons.

4. A scanning electron microscope as set forth in claim 3, wherein a condenser lens is disposed between said primary electron current detector and said final aperture plate to cause the condenser lens to focus the primary electron beam in the vicinity of said primary electron current detector.

5. A scanning electron microscope as set forth in claim 1, wherein means is provided for detecting an output of said primary electron current detector while the primary electron beam is deflected by said deflection means toward in a direction of said primary electron current detector and for identifying a current value of said primary electron beam with a maximum value obtained by the detector.

6. A scanning electron microscope as set forth in claim 1, wherein said deflection means is a deflection coil located at the same position as a scanning coil for scanning said primary electron beam on the specimen.

7. A scanning electron microscope as set forth in claim 1, wherein said primary electron current detector is made to be a arc shape with a center of a path of said primary electron beam.

8. A scanning electron microscope in which a primary electron beam emitted from an electron source is scanned on a specimen and secondary electrons emitted from the specimen being detected to obtain a scan image, said scanning electron microscope comprising a primary electron current detector in the form of a groove for detecting a primary electron current, provided in the vicinity of a path of the primary electron beam, deflection means for deflecting the primary electron beam toward said primary electron current detector to cause the primary electron beam to pass along a surface of the detector, and means for identifying a current value of said primary electron beam with a maximum current value obtained by the primary electron current detector.

9. A scanning electron microscope as set forth in claim 8, wherein said groove-shaped primary electron current detector is elongated in a direction substantially perpendicular to a deflection direction of said deflection means.

10. A scanning electron microscope as set forth in claim 8, wherein said primary electron current detector is arranged on an electron source side of an objective lens for converging the primary electron beam and on a specimen side of a final aperture plate for convergence of the primary electron beam.

11. A scanning electron microscope as set forth in claim 10, wherein a condenser lens is disposed between said primary electron current detector and said final aperture plate to cause the condenser lens to focus the primary electron beam in the vicinity of said primary electron current detector.

12. A scanning electron microscope as set forth in claim 8, wherein said deflection means is a deflection coil located at the same position as a scanning coil for scanning said primary electron beam on the specimen.

13. A scanning electron microscope as set forth in claim 8, wherein said primary electron current detector is made to be a arc shape with a center of a path of said primary electron beam.

14. A scanning electron microscope in which a primary electron beam emitted from an electron source is scanned on a specimen and secondary electrons emitted from the specimen being detected to obtain a scan image, said scanning electron microscope comprising a primary electron current detector for detecting a primary electron current which is provided in the vicinity of a path of the primary electron beam, deflection means for deflecting the primary electron beam to the detector, a final aperture plate for the primary electron beam which is disposed on an electron source side of said deflection means, and a condenser lens for control of a beam current which is disposed on the electron source side thereof, wherein said condenser lens for control of the beam current is controlled with a focal point of said condenser lens positioned at said detector to cause the beam current to coincide with a preset value.

15. A scanning electron microscope as set forth in claim 14, wherein said groove-shaped primary electron current detector is elongated in a direction substantially perpendicular to a deflection direction of said deflection means.

16. A scanning electron microscope as set forth in claim 14, wherein a condenser lens is disposed between said primary electron current detector and said final aperture plate to cause the condenser lens to focus the primary electron beam in the vicinity of said primary electron current detector.

17. A scanning electron microscope as set forth in claim 14, wherein means are provided for detecting an output of said primary electron current detector while the primary electron beam is deflected by said deflection means toward said primary electron current detector and for identifying a current value of said primary electron beam with a maximum value obtained by the detector.

18. A scanning electron microscope as set forth in claim 14, wherein said deflection means is a deflection coil located at the same position as a scanning coil for scanning said primary electron beam on the specimen.

19. A scanning electron microscope as set forth in claim 14, wherein said primary electron current detector is made to be an arc shape with a center on a path of said primary electron beam.

20. A method for detecting a primary electron beam current in a scanning electron microscope wherein a primary electron beam emitted from an electron source is scanned on a specimen, secondary electrons emitted from the specimen are detected to obtain a scan image, a primary electron current detector for detecting a primary electron current is provided in the vicinity of a path of the primary electron beam, deflection means for deflecting the primary electron beam is provided, a final aperture plate for the primary electron beam is disposed on an electron source side of said deflection means, and a condenser lens for control of a beam current is disposed on the electron source side thereof, said method comprising:

a first step of deflecting said primary electron beam toward said primary electron current detector and identifying a deflection position at which an output current of said primary electron current detector indicates its maximum; and a second step of, under a condition that the primary electron beam is positioned at said deflection position, controlling said condenser lens for control of the beam current to cause the beam current to coincide with a preset value.

21. A scanning electron microscope in which a primary electron beam emitted from an electron source is scanned on a specimen and secondary electrons emitted from the specimen are detected to obtain a scan image, said scanning electron microscope comprising a primary electron current detector in the form of a groove for detecting a primary electron current, provided in the vicinity of a path of the primary electron beam, and deflection means for deflecting the primary electron beam into the detector, wherein said primary electron current detector is arranged along an inner wall of a beam path in the scanning electron microscope.

22. A scanning electron microscope in which a primary electron beam emitted from an electron source is scanned on a specimen and secondary electrons emitted from the specimen are detected to obtain a scan image, said scanning electron microscope comprising a deflector for deflecting the primary electron beam, and a primary electron current detector elongated in a direction substantially perpendicular to a deflection direction of said deflector, arranged in the vicinity of a path of said primary electron beam.

* * * * *

REEXAMINATION CERTIFICATE (4179th)

United States Patent
Sato et al.

[11] B1 5,731,580
[45] Certificate Issued Oct. 17, 2000

[54] SCANNING ELECTRON MICROSCOPE

[75] Inventors: Mitgugu Sato; Naomasa Suzuki, both of Hitachinaka, Japan

[73] Assignee: Hitachi, Ltd., Tokyo, Japan

Reexamination Request:
No. 90/005,395, Sep. 20, 1999

Reexamination Certificate for:
Patent No.: 5,731,580
Issued: Mar. 24, 1998
Appl. No.: 08/770,076
Filed: Dec. 19, 1996

[30]     Foreign Application Priority Data

Dec. 20, 1995  [JP]  Japan ................................. 7-331492

[51] Int. Cl.[7] ........................ H01J 37/256; H01J 37/244
[52] U.S. Cl. ........................................... 250/310; 250/397
[58] Field of Search ..................... 250/310, 397

[56]            References Cited

PUBLICATIONS

Japanese Published Patent Application No. 07105888, Inventor: Etsuo Ban, Apr. 21, 1995.

*Primary Examiner*—Jack Berman

[57]            ABSTRACT

A scanning electron microscope in which means for generating crossed electric and magnetic fields is provided on an electron source side of an objective lens, secondary electrons emitted from a specimen are detected through the crossed electric and magnetic fields (E+B), a deflecting electrode or a deflecting coil is provided in a scanning coil part, means for detecting a beam current is provided in the crossed electric and magnetic fields, whereby accurate measurement of the beam current can be realized while maintaining the array of a high resolution optical system without need for performing mechanical or electrical adjustment.

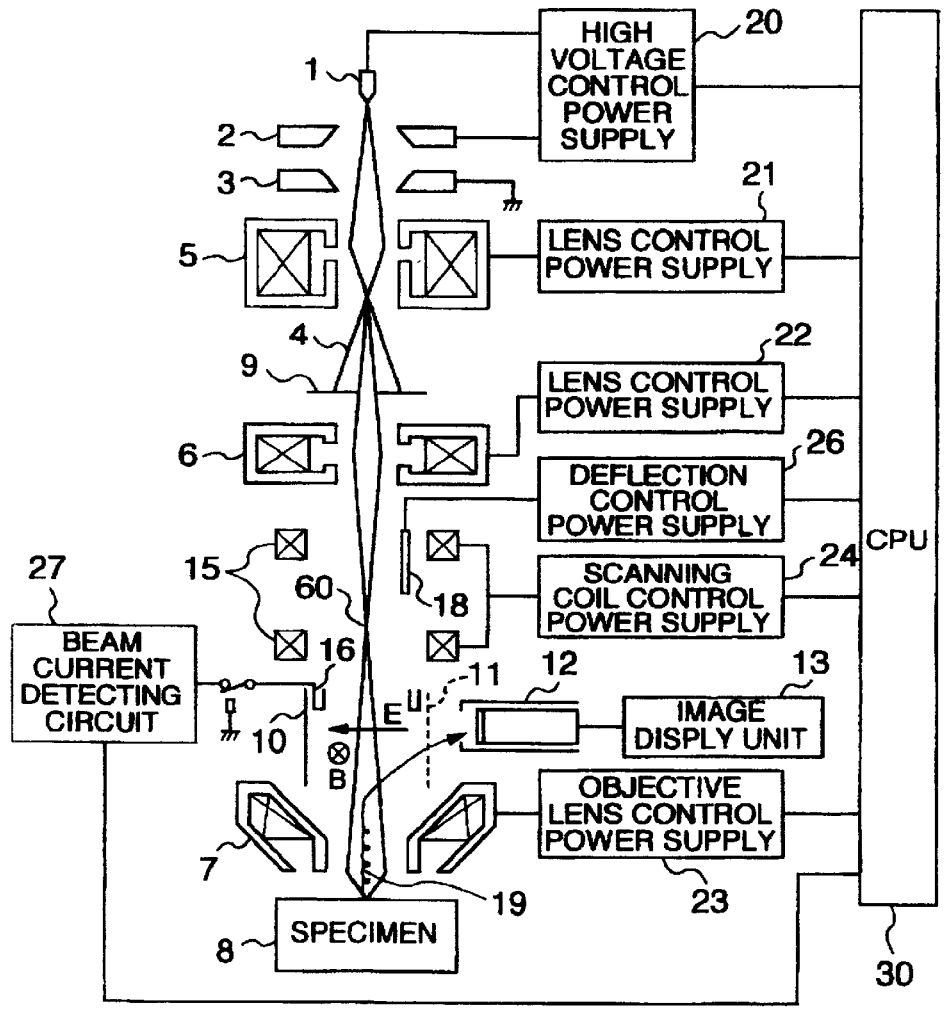

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 14–20 and 22 is confirmed.

Claims 1, 8 and 21 are determined to be patentable as amended.

Claims 2–7 and 9–13, dependent on an amended claim, are determined to be patentable.

1. A scanning electron microscope in which a primary electron beam emitted from an electron source is scanned on a specimen and secondary electrons emitted from the specimen being detected to obtain a scan image, said scanning electron microscope comprising a primary electron current detector in the form of a groove for detecting a primary electron current, provided in the vicinity of a path of the primary electron beam and deflection means for deflecting the primary electron beam into the detector, *the groove extending in a direction which intersects a direction to which the beam is deflected by said deflection means.*

8. A scanning electron microscope in which a primary electron beam emitted from an electron source is scanned on a specimen and secondary electrons emitted from the specimen being detected to obtain a scan image, said scanning electron microscope comprising a primary electron current detector in the form of a groove for detecting a primary electron current, provided in the vicinity of a path of the primary electron beam, deflection means for deflecting the primary electron beam toward said primary electron current detector to cause the primary electron beam to pass along a surface of the detector, and means for identifying a current value of said primary electron beam with a maximum current value obtained by the primary electron current detector, *the groove extending in a direction which intersects a direction to which the beam is deflected by said deflection means.*

21. A scanning electron microscope in which a primary electron beam emitted from an electron source is scanned on a specimen and secondary electrons emitted from the specimen are detected to obtain a scan image, said scanning electron microscope comprising a primary electron current detector in the form of a groove for detecting a primary electron current, provided in the vicinity of a path of the primary electron beam, and deflection means for deflecting the primary electron beam into the detector, *the groove extending in a direction which intersects a direction to which the beam is deflected by said deflection means, and* wherein said primary electron current detector is arranged along an inner wall of a beam path in the scanning electron microscope.

* * * * *